US011600806B2

(12) United States Patent
Yu et al.

(10) Patent No.: US 11,600,806 B2
(45) Date of Patent: Mar. 7, 2023

(54) AUXILIARY METHOD AND DEVICE FOR OTP ADJUSTMENT OF DISPLAY PANEL

(71) Applicant: KUNSHAN GO-VISIONOX OPTO-ELECTRONICS CO., LTD., Kunshan (CN)

(72) Inventors: Wei Yu, Kunshan (CN); Junfeng Li, Kunshan (CN); Yuehua Zhang, Kunshan (CN); Zheng Liu, Kunshan (CN); Xiaodong Sun, Kunshan (CN)

(73) Assignee: KUNSHAN GO-VISIONOX OPTO-ELECTRONICS CO., LTD., Kunshan (CN)

( * ) Notice: Subject to any disclaimer, the term of this patent is extended or adjusted under 35 U.S.C. 154(b) by 440 days.

(21) Appl. No.: 17/015,091

(22) Filed: Sep. 9, 2020

(65) Prior Publication Data

US 2020/0411805 A1 Dec. 31, 2020

Related U.S. Application Data

(63) Continuation of application No. PCT/CN2019/086035, filed on May 8, 2019.

(30) Foreign Application Priority Data

Nov. 29, 2018 (CN) .......................... 201811447293.2

(51) Int. Cl.
*G01R 27/02* (2006.01)
*G01R 31/70* (2020.01)
(Continued)

(52) U.S. Cl.
CPC .............. *H01L 51/56* (2013.01); *G01R 27/02* (2013.01); *H01L 27/3276* (2013.01);
(Continued)

(58) Field of Classification Search
CPC ........ G01R 27/00; G01R 27/02; G01R 31/00; G01R 31/50; G01R 31/66; G01R 31/70;
(Continued)

(56) References Cited

U.S. PATENT DOCUMENTS

2016/0323267 A1 11/2016 Sun et al.
2018/0226044 A1 8/2018 Xing et al.

FOREIGN PATENT DOCUMENTS

CN 102005165 A 4/2011
CN 102749743 A * 10/2012 ......... G02F 1/13452
(Continued)

OTHER PUBLICATIONS

First Official Action and Search Report for Chinese Application No. 201811447293.2, dated Feb. 27, 2020, 8 pages.
(Continued)

*Primary Examiner* — Hoai-An D. Nguyen
(74) *Attorney, Agent, or Firm* — Kilpatrick Townsend & Stockton

(57) ABSTRACT

The application discloses an auxiliary method and device for one time programmable (OTP) adjustment of a display panel. The auxiliary method includes: crimping and conducting a flexible circuit board to a display panel bonded with a chip by means of pre-bonding, to lead a crimping impedance by the flexible circuit board; detecting the crimping impedance led by the flexible circuit board; and screening a detected crimping impedance value to determine whether the OTP adjustment is enabled, wherein when the crimping impedance value meets a preset condition, the OTP adjustment is enabled, and when the crimping impedance value does not meet the preset condition, the OTP adjustment is disabled.

16 Claims, 7 Drawing Sheets

(51) Int. Cl.
*H01L 51/56* (2006.01)
*H01L 27/32* (2006.01)
*H01L 51/00* (2006.01)

(52) U.S. Cl.
CPC .......... *G01R 31/70* (2020.01); *H01L 51/0031* (2013.01); *H01L 2251/568* (2013.01)

(58) Field of Classification Search
CPC . H01L 51/00; H01L 51/0001; H01L 51/0031; H01L 51/50; H01L 51/56; H01L 2251/00; H01L 2251/50; H01L 2251/56; H01L 2251/568; H01L 27/00; H01L 27/28; H01L 27/32; H01L 27/3241; H01L 27/3244; H01L 27/3276; G09G 3/00; G09G 3/20; G09G 3/22; G09G 3/30; G09G 3/32; G09G 3/3208; G09G 3/3225
USPC .................................. 324/323, 345
See application file for complete search history.

(56) References Cited

FOREIGN PATENT DOCUMENTS

| | | | |
|---|---|---|---|
| CN | 103323963 A | 9/2013 | |
| CN | 103426409 A | 12/2013 | |
| CN | 203760047 U | 8/2014 | |
| CN | 104569605 A | 4/2015 | |
| CN | 204348296 U | * 5/2015 | ............... G09G 3/00 |
| CN | 104749478 A | 7/2015 | |
| CN | 105609028 A | 5/2016 | |
| CN | 205487266 U | * 8/2016 | ............... G09G 3/00 |
| CN | 106125809 A | 11/2016 | |
| CN | 205992038 U | 3/2017 | |
| CN | 106932643 A | 7/2017 | |
| CN | 104320929 B | 8/2017 | |
| CN | 107610625 A | 1/2018 | |
| CN | 107658234 A | 2/2018 | |
| CN | 104749478 B | * 6/2018 | ............. G01R 31/02 |
| CN | 108594017 A | 9/2018 | |
| CN | 108648673 A | 10/2018 | |
| CN | 109493799 A | 3/2019 | |
| JP | 2014146411 A | 8/2014 | |
| KR | 100562621 B1 | 3/2006 | |
| KR | 20090004105 A | 1/2009 | |
| TW | 200820191 A | 5/2008 | |
| TW | 201011317 A | 3/2010 | |
| TW | 1460700 B | 11/2014 | |
| TW | 201830628 A | 8/2018 | |

OTHER PUBLICATIONS

PCT international Search Report for PCT/CN2019/086035, dated Sep. 3, 2019, 14 pages.
First Official Action and Search Report for Taiwanese Application No. 108116560, dated Aug. 20, 2019, 4 pages.

* cited by examiner

AUXILIARY METHOD AND DEVICE FOR OTP ADJUSTMENT OF DISPLAY PANEL

CROSS REFERENCE TO RELATED APPLICATION

The application is a continuation of International Application No. PCT/CN2019/086035 filed on May 8, 2019, which claims the benefit of priority to Chinese Patent Application No. 201811447293.2 filed on Nov. 29, 2018. Both applications are incorporated herein by reference in their entireties.

TECHNICAL FIELD

The application relates to the field of display technology.

BACKGROUND

Organic Light Emitting Diode (OLED) is a technology that converts electrical energy into light energy through organic light emitting materials by use of a phenomenon that the organic light emitting materials emit light by carrier injection and recombination under the action of an electric field. The OLED may include an Active matrix OLED (AMOLED) and a Passive matrix OLED (PMOLED). The OLED display is a new generation of display technology after a Cathode Ray Tube (CRT) display and a Liquid Crystal Display (LCD), and is called a "fantastic" display technology. The AMOLED has a characteristic of self-luminescence and uses a very thin organic material coating and a substrate. When an electric current flows, the organic materials may emit light. Compared with a traditional liquid crystal display, the AMOLED can achieve a thinner size, a wider visual angle and a higher refresh rate, so the AMOLED is being widely adopted by various terminal devices. Over the past, there have been various challenges on the development of AMOLED devices.

SUMMARY

The present application provides an auxiliary method and device for One Time Programmable (OTP) adjustment of a display panel.

In an aspect, the present application provides an auxiliary method for one time programmable (OTP) adjustment of a display panel bonded with a chip. The method includes: crimping and conducting a flexible circuit board to the display panel by means of pre-bonding, to lead a crimping impedance by the flexible circuit board; detecting the crimping impedance led by the flexible circuit board; and screening a detected crimping impedance value to determine whether the OTP adjustment is allowed, wherein when the crimping impedance value meets a preset condition, the OTP adjustment is allowed, and when the crimping impedance value does not meet the preset condition, the OTP adjustment is not allowed. In the above described method, the step of crimping and conducting a flexible circuit board to the display panel by means of pre-bonding, to lead a crimping impedance by the flexible circuit board may specifically include: crimping the flexible circuit board to the display panel by means of pre-bonding, so as to make the flexible circuit board and the display panel conductive to each other while no conductive particles are generated between the flexible circuit board and the display panel; and leading a crimping impedance by the flexible circuit board.

According to an implementation of the aspect of the present application, the flexible circuit board includes a crimping terminal area, and the display panel includes a bonding terminal area corresponding to the crimping terminal area.

According to any foregoing implementation of the aspect of the present application, alignment marks are disposed on both sides of the bonding terminal area and both sides of the crimping terminal area, and the auxiliary method further includes: crimping the crimping terminal area to the bonding terminal area by aligning the alignment marks.

According to any foregoing implementation of the aspect of the present application, the crimping terminal area of the flexible circuit board includes a crimping impedance test terminal area and the bonding terminal area of the display panel also includes a crimping impedance test terminal area, and the crimping impedance test terminal area of the flexible circuit board is conductive to the crimping impedance test terminal area of the display panel.

According to any foregoing implementation of the aspect of the present application, the auxiliary method further includes: electrically connecting the flexible circuit board to an impedance test board configured to detect the crimping impedance led by the flexible circuit board.

According to any foregoing implementation of the aspect of the present application, the auxiliary method further includes: communicatively connecting the impedance test board to an upper computer configured to screen the crimping impedance value detected by the impedance test board to determine whether the OTP adjustment is allowed.

According to any foregoing implementation of the aspect of the present application, the auxiliary method further includes: detecting, by the impedance test board in response to receiving a detection command from the upper computer, the crimping impedance led by the flexible circuit board, and feeding the detected crimping impedance value back to the upper computer after completing detection.

According to any foregoing implementation of the aspect of the present application, the impedance test board includes a voltage divider resistor network, an analog-to-digital converter (ADC), a microcontroller unit (MCU) and a serial port, the crimping impedance is a resistance in the voltage divider resistor network, the ADC is configured to sample a divided voltage value in the voltage divider resistor network, the MCU is configured to calculate a resistance value of the crimping impedance according to the divided voltage value, and the resistance value is transmitted to the upper computer via the serial port.

According to any foregoing implementation of the aspect of the present application, the flexible circuit board is electrically connected to an input end of the impedance test board by a zero insertion force (ZIF) method.

According to any foregoing implementation of the aspect of the present application, the preset condition is that the crimping impedance value is less than or equal to a preset threshold of 0 to 100Ω. For example, the preset threshold is 10Ω.

According to any foregoing implementation of the aspect of the present application, the display panel includes a display panel using an Active matrix OLED (AMOLED).

In another aspect, the present application provides an auxiliary device for one time programmable (OTP) adjustment of a display panel, including: a flexible circuit board to be crimped and conducted to the display panel by means of pre-bonding; and an impedance test board electrically connected to the flexible circuit board; wherein the flexible circuit board is configured to lead a crimping impedance, and the impedance test board is configured to detect the crimping impedance led by the flexible circuit board; and the impedance test board is communicatively connected to at least one upper computer configured to screen a crimping impedance value detected by the impedance test board to determine whether the OTP adjustment is allowed.

According to an implementation of another aspect of the present application, the flexible circuit board includes a crimping terminal area, and the display panel includes a bonding terminal area corresponding to the crimping terminal area.

According to any foregoing implementation of another aspect of the present application, alignment marks are disposed on both sides of the bonding terminal area and both sides of the crimping terminal area, and the crimping terminal area is crimped to the bonding terminal area by alignment of the alignment marks.

According to any foregoing implementation of another aspect of the present application, the crimping terminal area of the flexible circuit board includes a crimping impedance test terminal area and the bonding terminal area of the display panel also includes a crimping impedance test terminal area, and the crimping impedance test terminal area of the flexible circuit board is conductive to the crimping impedance test terminal area of the display panel.

According to any foregoing implementation of another aspect of the present application, the impedance test board includes a voltage divider resistor network, an analog-to-digital converter (ADC), a microcontroller unit (MCU) and a serial port; and during operation, the crimping impedance is a resistance in the voltage divider resistor network, the ADC is to sample a divided voltage value in the voltage divider resistor network, the MCU is to calculate a resistance value of the crimping impedance according to the divided voltage value, and the resistance value is transmitted to the upper computer via the serial port.

According to any foregoing implementation of another aspect of the present application, the display panel includes a display panel using an Active matrix OLED (AMOLED).

According to the present application, in order to perform the OTP adjustment on the COG form product, the flexible circuit board and the display panel may be connected by a pre-bonding and crimping connection without an intermediary medium between the flexible circuit board and the display panel. There is no need to bond the flexible circuit board to the display panel and accordingly no need to remove the flexible circuit. It may be possible to save precious manual labor and material resources, improve operating efficiency to a certain extent and reduce production costs.

BRIEF DESCRIPTION OF THE DRAWINGS

Features, advantages, and technical effects of exemplary embodiments of the present application will be described below with reference to accompanying drawings. The drawings are not drawn to real scale.

DETAILED DESCRIPTION

As mentioned above, there have been various technical challenges associated with AMOLED devices. Based on characteristics of an AMOLED display screen, to solve the problem of color coordinate offset of the screen body, a one-time programmable (OTP) adjustment needs to be performed for the AMOLED screen body. Generally, it is required to bond an Integrated Circuit (IC, also called a chip) on the AMOLED screen body to form a chip-on-glass (COG) form product, then bond a flexible circuit board on the COG form product, and then perform the OTP adjustment. After the adjustment is completed, the flexible circuit board needs to be removed, which is time-consuming and labor-intensive and increases input costs.

Implementations of the present application will be described in further detail below with reference to the drawings and embodiments. The detailed description and drawings of the following embodiments are used to exemplarily illustrate the principle of the present application, but cannot be used to limit the scope of the present application. That is, the present application is not limited to the described embodiments.

The present application proposes a solution to crimp a flexible circuit board to a display panel by means of pre-bonding, and then detect a crimping impedance and determine whether to perform an OTP adjustment. In the embodiment of the present application, the flexible circuit board may be crimped to the display panel by means of pre-bonding, the crimping impedance may be led through the flexible circuit board, then the led crimping impedance may be detected, and whether the OTP adjustment is allowed may be determined by judging whether the crimping impedance meets a condition.

Figure 2:
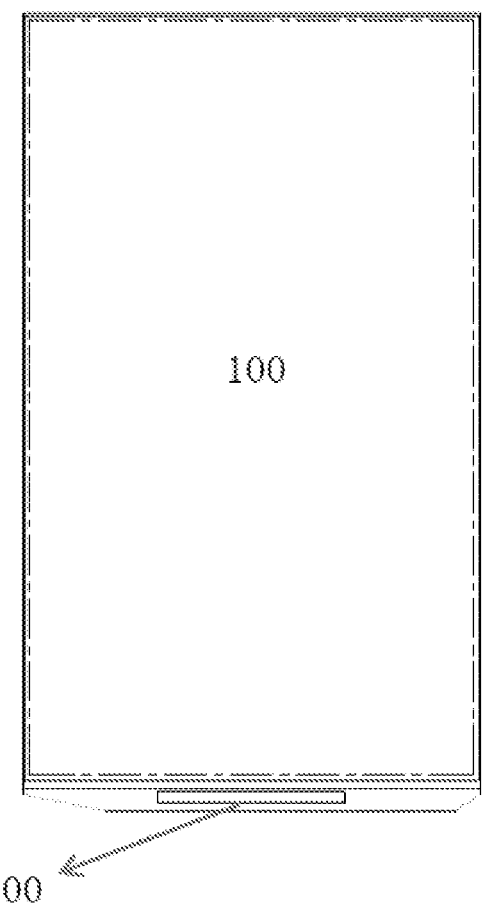
FIG. 2 is a schematic diagram of a typical COG form product.

The display panel may be various display panels having a display area and a non-display area to be subjected to OTP adjustment, such as an AMOLED display panel. Due to the conceptual characteristics of the present application, the embodiments of the present application may be particularly suitable for a COG form display panel obtained after bonding a chip IC, and the specific structure thereof can be known by referring to FIG. 2. For such a COG form display panel, the OTP adjustment cannot be performed without the assistance of the flexible circuit board, so the embodiments of the present application may be more targeted for this situation.

In an implementation of the present application, the flexible circuit board may be crimped to the display panel by means of pre-bonding, and the crimping impedance may be detected by using an impedance test board. During the operation, an upper-layer software may be used to perform screening for the crimping impedance value, and the OTP adjustment can be performed once the impedance value meets a preset condition. The "screening" mentioned herein may refer to a process of comparing the impedance value with a preset value and then making a corresponding processing. For example, when the crimping impedance value meets the preset condition, the OTP adjustment may be allowed, and when the crimping impedance value does not meet the preset condition, the OTP adjustment may be not allowed.

In an implementation of the present application, the preset condition may be the crimping impedance value is less than or equal to a preset threshold. The preset threshold may be 0-100Ω, e.g. 10Ω.

In an implementation of the present application, the flexible circuit board and the display panel of the embodiment of the present application may be crimped together by means of pre-bonding, so that a crimping impedance test terminal on the display panel may be connected and conductive to a crimping impedance test terminal on the flexible circuit board. The crimping impedance may be led through a lead of the flexible circuit board, and the lead of the flexible circuit board may be connected to the impedance test board, so that the crimping impedance led through the flexible circuit board may be detected by the impedance test board. The impedance test board may also exchange information with an upper computer. The "pre-bonding" mentioned herein may be sometimes called pre-pressing, which means that the flexible circuit board is directly crimped on the display panel without an intermediary medium (such as anisotropic conductive adhesive). The flexible circuit board and the display panel can be conductive to each other after being crimped, and no conductive particles are generated.

In the embodiment of the present application, the upper computer may generally refer to a computer that can issue a control command to a device connected to the upper computer, and may usually be a computer PC loaded with software (such as a control system). An operator can issue an operation command through the upper computer. There may be one or more upper computers, and at least one upper computer may be communicatively connected to the impedance test board. It may be also possible that multiple upper computers are all communicatively connected to the impedance test board for exchange of various information.

In the embodiment of the present application, the impedance test board may be used to detect the crimping impedance led by the flexible circuit board. The "detection" herein may be an active and continuous detection. For example, an automatic detection program can be set in the upper-layer software to perform the detection process for each device. When the impedance test board receives a detection command from the upper computer, the impedance test board may acquire data output from the flexible circuit board, obtain a test value of the crimping impedance after necessary calculation, and feedback the test value to the upper computer for subsequent processing.

In an implementation of the present application, the flexible circuit board may be connected to an input end of the impedance test board through a Zero Insertion Force (ZIF) method. By using the ZIF connection, a quick plug connection between the flexible circuit board and the impedance test board, a high reliability and a low signal crosstalk can be realized. In other implementations, other suitable connection methods may also be adopted.

In the embodiment of the present application, the upper computer may perform screening for the crimping impedance value to determine a timing when the OTP adjustment can be performed. The upper computer may send a detection command to the impedance test board, obtain a test value (a measured value) of the crimping impedance fed back from the impedance test board, and then compare the test value with a preset impedance threshold. If a condition is met, the OTP adjustment may be performed; in addition, if the condition is not met, an alarm may be issued. Specific methods and processes for the OTP adjustment may not be particularly limited herein, and an existing OTP adjustment method may be used.

In an implementation of the present application, the upper computer may compare the measured value of the crimping impedance with the preset impedance threshold. When the measured value is less than or equal to the impedance threshold, the OTP adjustment can be performed; in addition, when the measured value is greater than the impedance threshold, an alarm may be issued, and at this time, the OTP adjustment cannot be performed. When the alarm is cleared, that is, when the condition that the measured value is less than or equal to the impedance threshold is met, the OTP adjustment can be performed.

A host computer upper-layer software in the upper computer may include software or programs that can perform numerical comparison. The upper-layer software may also set different levels for the preset impedance threshold to meet different application requirements in practice. For example, if the requirement for the OTP quality is high, the impedance threshold may be set to 10Ω, and if the requirement for the OTP quality is not high, the impedance threshold may be set to 20Ω or 30Ω, and so on.

Figure 1:
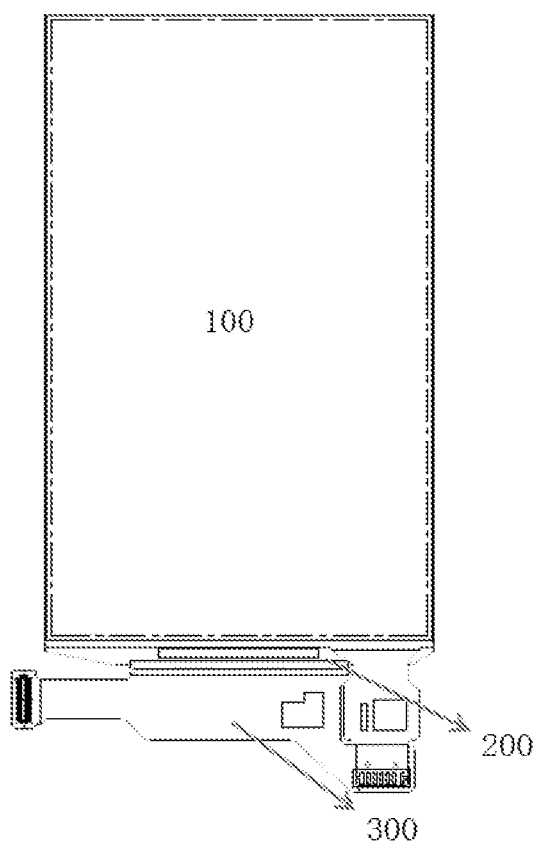
FIG. 1 is a schematic diagram of an AMOLED screen bonded with an IC and a flexible circuit board.
Figure 3:
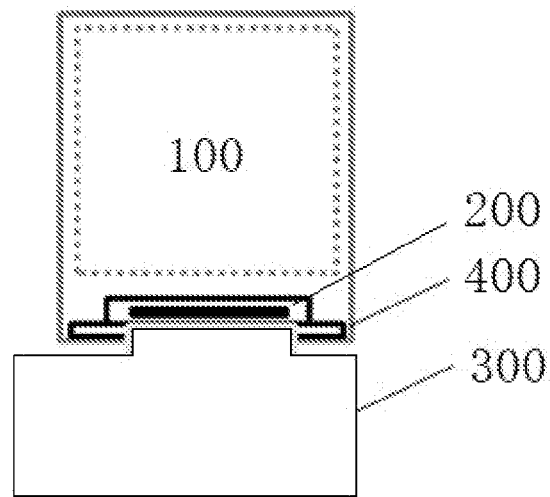
FIG. 3 is a schematic diagram of bonding a flexible circuit board based on anisotropic conductive adhesive.

In the embodiment of the present application, the flexible circuit board and the display panel may be connected by means of pre-bonding. In contrast, as shown in FIG. 1 and FIG. 3, the flexible circuit board 300 and the AMOLED screen body 100 may be bonded and conducted using anisotropic conductive adhesive. The bonding process may include firstly bonding the IC 200 on the AMOLED screen body 100, then bonding the flexible circuit board 300, and then performing the OTP adjustment and modifying color coordinates of the screen body by a parameter preset method for the chip. Since the anisotropic conductive adhesive 400 is used to connect and conduct the flexible circuit board 300, the IC 200 and the AMOLED screen body 100, the impedance value after bonding may directly affect the quality of the OTP. The impedance value may depend on the number of conductive particles in the anisotropic conductive adhesive. By use of this bonding method, removing the flexible circuit board 300 from the AMOLED screen body 100 may be time-consuming and labor-intensive and have a high cost.

In contrast, according to the embodiments of the present application, the flexible circuit board and the display panel may be crimped by means of pre-bonding without using any intermediary medium. According to the embodiments of the present application, the OTP adjustment can be performed for the COG form product without need of bonding the flexible circuit board, so there is no need to remove the flexible circuit board, thereby saving precious manual labor and material resources and achieving the purpose of reducing production costs. Furthermore, according to a traditional bonding scheme, the impedance cannot be automatically tested, while according to some embodiments of the present application, an automatic impedance detection can be realized.

In addition, there may be no conductive particles between the display panel and the flexible circuit board according to the embodiments of the present application. When using the OTP adjustment method provided by the embodiments of the present application, the product may need to be subjected to a 100% impedance value test after crimping, and the impedance value may be screened, so as to ensure that the OTP adjustment is performed only when the impedance value meets the condition, thereby ensuring that the crimping impedance meets the requirements before the OTP adjustment. The embodiments of the present application may also provide the possibility of mass production and shipment of COG form products.

The implementation process of the present application will be described below by taking the AMOLED screen body as an example of the display panel.

Figure 4:
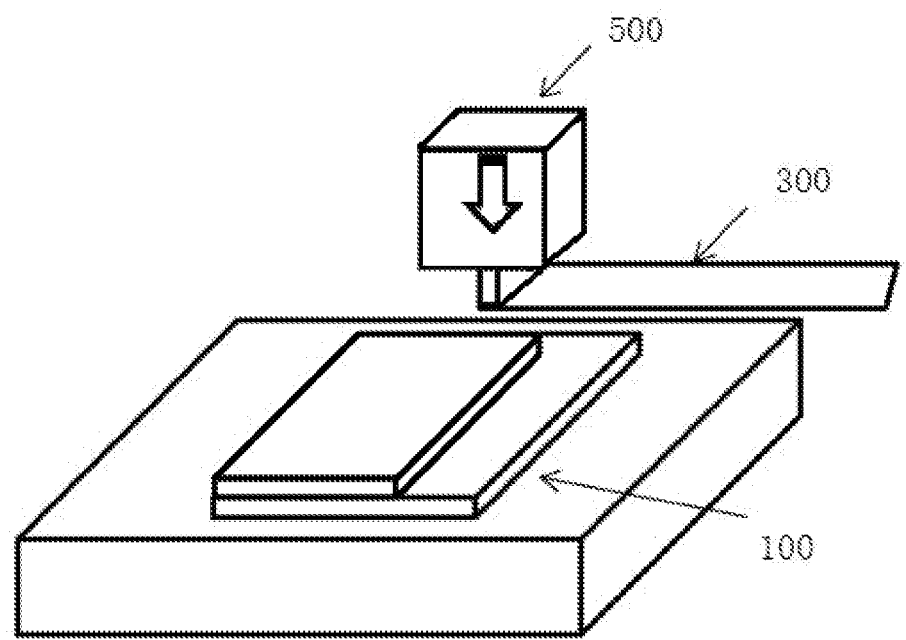
FIG. 4 is a schematic diagram showing an effect of pre-bonding and crimping according to an embodiment of the present application.
Figure 5:
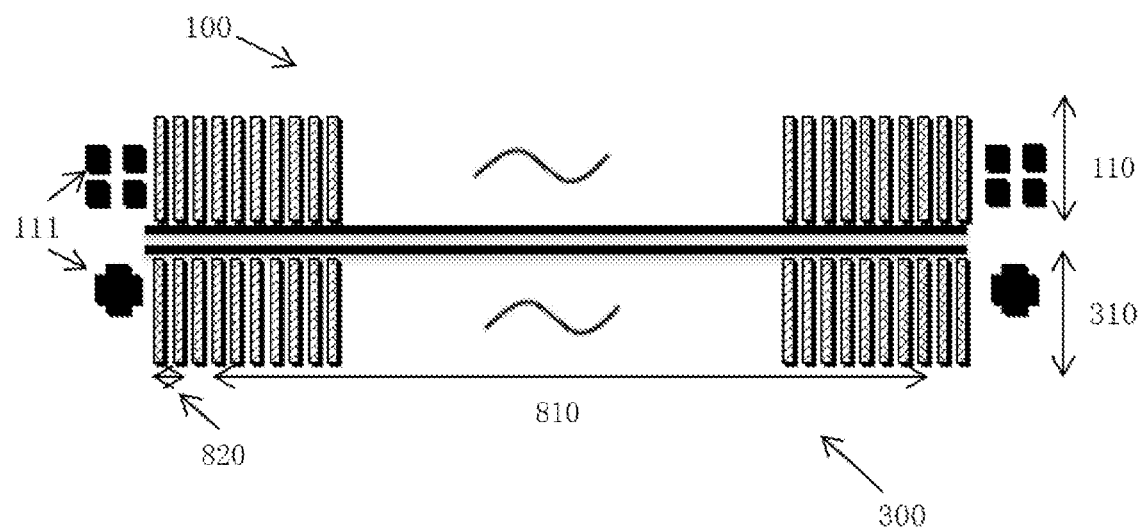
FIG. 5 is a schematic diagram of terminal areas of an AMOLED screen and a flexible circuit board according to an embodiment of the present application.

FIG. 4 shows a schematic diagram showing an effect of pre-bonding and crimping according to an embodiment of the present application. The flexible circuit board 300 may be crimped to the AMOLED screen body 100 by use of a pressing head 500 (the AMOLED screen body 100 is in the COG form) to make the flexible circuit board 300 and the AMOLED screen body 100 conductive to each other. FIG. 5 shows a schematic diagram of terminal areas of the AMOLED screen body 100 and the flexible circuit board 300 according to the embodiment of the present application. As shown in FIG. 5, the flexible circuit board 300 may have a crimping terminal area 310, the AMOLED screen body 100 may also have a corresponding bonding terminal area 110, and there may be paired alignment marks (Mark) 111 on both sides of the terminal areas. In an implementation of the present application, when the COG form product lights the screen body, the crimping terminal area 310 of the flexible circuit board may be crimped to the bonding terminal area 110 of the screen body by alignment of the Marks 111.

Furthermore, along the lateral direction in FIG. 5, both the bonding terminal area 110 of the screen body and the crimping terminal area 310 of the flexible circuit board may include a signal terminal area 810 and a crimping impedance test terminal area 820. After pre-bonding and crimping, upper and lower crimping impedance test terminal areas 820 can be conductive to each other.

Figure 6:
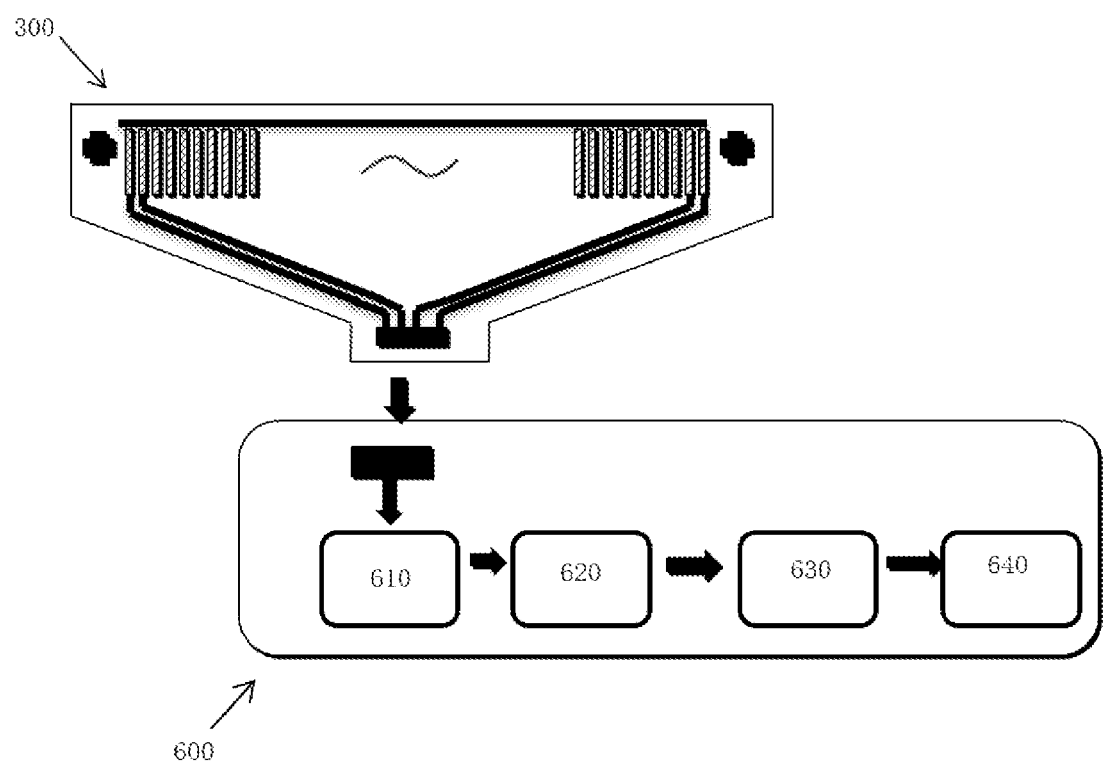
FIG. 6 is a schematic diagram of a connection between a flexible circuit board and an impedance test board according to an embodiment of the present application.

FIG. 6 shows a schematic diagram of a connection between the flexible circuit board 300 and the impedance test board 600 according to an embodiment of the present application, and also schematically shows the structure of the impedance test board 600. In the embodiment, the crimping impedance test terminal area of the flexible circuit board 300 may be connected to the input end of the impedance test board 600 by the ZIF method.

Referring to FIG. 6, the impedance test board 600 may include a voltage divider resistor network 610, an Analog-to-Digital Converter (ADC) 620, a Microcontroller Unit (MCU) 630, and a serial port 640. The crimping impedance may be introduced as a resistance in the voltage divider resistor network 610. The ADC 620 may sample and obtain a divided voltage value. According to the divided voltage value, the MCU 630 may calculate the resistance value (the value of the crimping impedance). The resistance value may be fed back to the upper computer via the serial port 640 for subsequent processing.

Here, the connection between the flexible circuit board and the impedance test board may be realized by the ZIF method, and various known connectors may also be used for the connection. The voltage divider resistor network may be a device containing multiple voltage divider resistors and may be a hardware. The serial port may be a common RS232 serial port or other suitable serial ports. Both ADC and MCU can be implemented using devices well known in the art. The structure and/or working principle of the known hardware or the interface itself can be selected and applied by those skilled in the art, and thus will not be repeated here.

Furthermore, the crimping impedance may be led to the impedance test board 600 through a lead from an impedance test point of the flexible circuit board 300, and the detection of the crimping impedance may be realized. During the detection of the crimping impedance, the upper computer may perform screening for the crimping impedance to determine the timing when the OPT adjustment is allowed.

Figure 7:
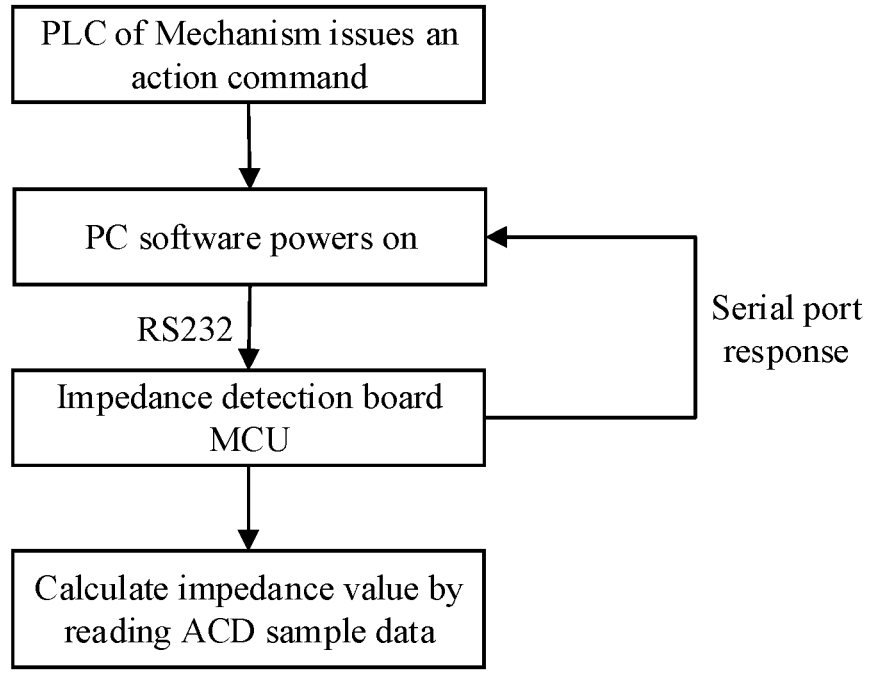
FIG. 7 is a schematic diagram of a working process of an impedance test board according to an embodiment of the present application.

FIG. 7 shows a schematic diagram of a working process of the impedance test board 600 according to an embodiment of the present application. Referring to FIG. 6 and FIG. 7, when a programmable logic controller (PLC) of a mechanism (such as an OTP adjustment mechanism) issues an action command, the upper computer may send a command to the impedance detection board MCU 630 via, for example, an RS232 serial port to query the impedance detection value; the impedance detection board MCU 630 may sample through the ADC 620, calculate the resistance value (crimping impedance test value) across left and right measurement points on the flexible circuit board 300 according to the divided voltage on the voltage divider resistor network 610, and feedback the resistance value to the host computer through the serial port; after receiving the feedback resistance value, the host computer upper-layer software may compare the resistance value with the preset impedance threshold; taking the impedance threshold of 10Ω as an example, if the test value is less than or equal to 10Ω, the OTP adjustment may be performed, and if the test value is greater than 10Ω, an alarm may be issued and the OTP adjustment may not be performed before the alarm is cleared.

In order to detect the value of the crimping impedance led by the flexible circuit board, the embodiments of the present application may also use a test device or equipment other than the impedance test board 600 shown in FIG. 6. For example, a test device with wireless communication function can achieve the same goal.

FIG. 8 to FIG. 11 are multiple effect diagrams related to the embodiments of the present application, which can better show and demonstrate the effects before and after the embodiments of the present application are adopted.

Figure 8:
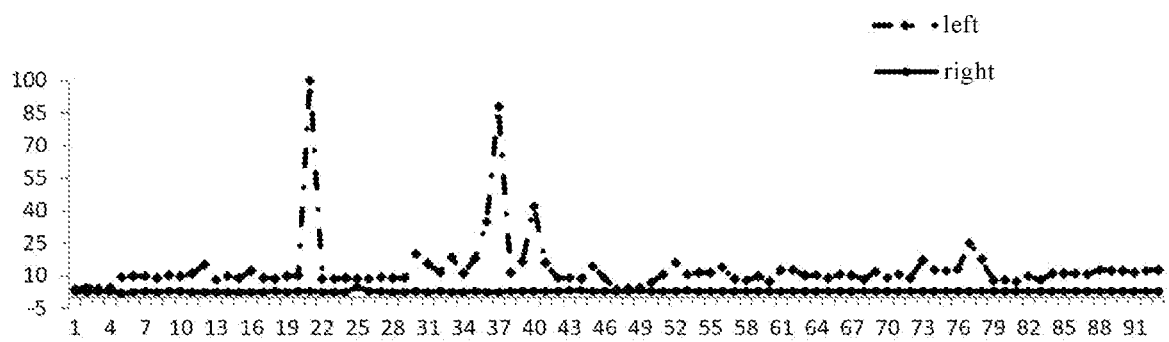
FIG. 8 is a trend chart of a crimping impedance for a COG OTP device solution after adopting an embodiment of the present application, and the impedance is controlled to be less than 100Ω.

FIG. 8 is a trend chart of a crimping impedance for a COG OTP device solution. The abscissa may represent a number of experimental screen bodies, and the ordinate may represent an impedance value. The dotted and solid lines in the figure may correspond to the impedance detection data on the left and right sides of the flexible circuit board respectively. The impedance is controlled to be less than 100Ω.

Figure 9:
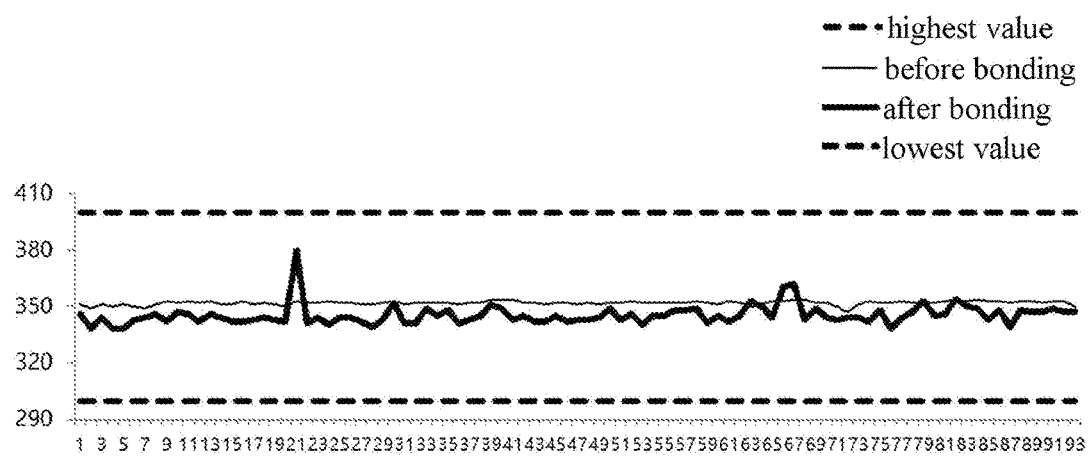
FIG. 9 is a brightness comparison chart before and after bonding for a COG OTP device solution of FIG. 8.

FIG. 9 is a brightness comparison chart before and after bonding for a COG OTP device solution. The abscissa may represent a corresponding number of the screen bodies the same as those in FIG. 8, and the ordinate may represent a brightness value of the screen body after the OTP. The chart may include a brightness graph (thin line) corresponding to the OTP adjustment by means of pre-bonding, and a corresponding read-back brightness graph (thick line) for a same screen body after bonding. It can be seen from the data in FIG. 9 that the brightness values corresponding to a stable crimping impedance are stable and within a specification range.

Figure 10:
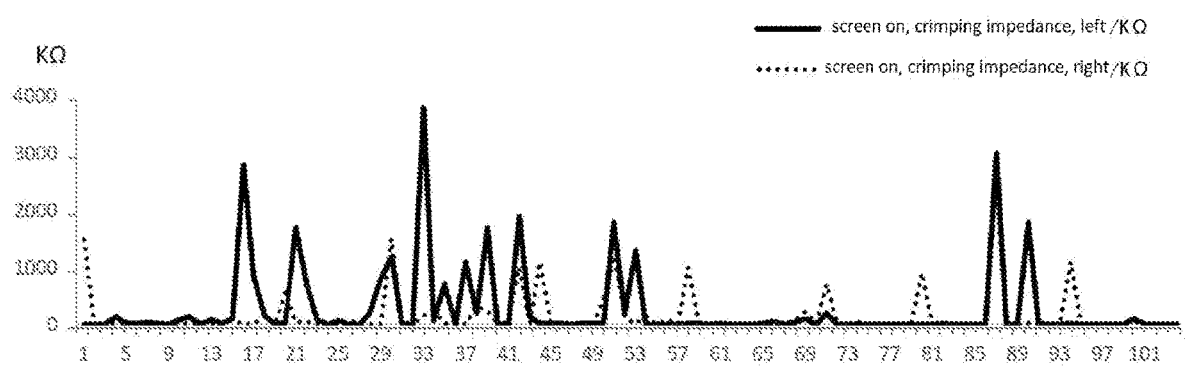
FIG. 10 is a trend chart of a crimping impedance for a COG OTP device solution after adopting an embodiment of the present application, and the impedance is not controlled.

FIG. 10 is a trend chart of a crimping impedance for a COG OTP device solution. The abscissa may represent a number of experimental screen bodies, and the ordinate may represent an impedance value. The dotted and solid lines in the figure may correspond to the impedance detection data on the left and right sides of the flexible circuit board respectively. The impedance is not controlled.

Figure 11:
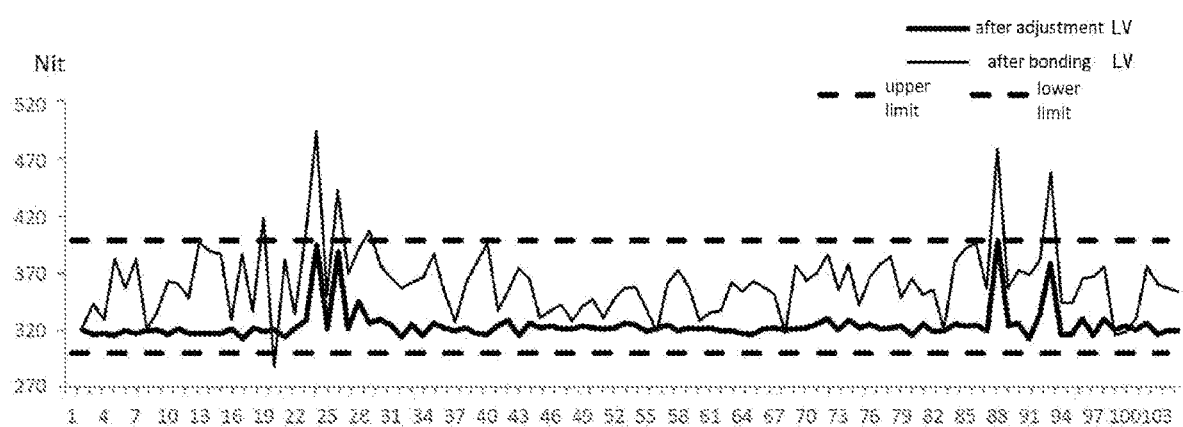
FIG. 11 is a brightness comparison chart before and after bonding for a COG OTP device solution of FIG. 10.

FIG. 11 is a brightness comparison chart before and after bonding for a COG OTP device solution. The abscissa may represent a corresponding number of the screen bodies the same as those in FIG. 10, and the ordinate may represent a brightness value of the screen body after the OTP. The chart may include a brightness graph (thin line) corresponding to the OTP adjustment by means of pre-bonding, and a corresponding read-back brightness graph (thick line) for a same screen body after bonding. It can be seen from the data in FIG. 11 that the crimping impedance is not controlled or screened and the corresponding brightness values are not stable and go beyond the specification range.

Although the present application has been described with reference to preferred embodiments, various improvements can be made and components therein can be replaced with equivalents without departing from the scope of the present application. Particularly, as long as there is no structural conflict, various technical features mentioned in various embodiments can be combined in any way. The present application is not limited to specific embodiments disclosed herein, but includes all technical solutions falling within the scope of the claims.

What is claimed is:

1. An auxiliary method, adapted for one time programmable adjustment of a display panel bonded with a chip, comprising:
    crimping and conducting a flexible circuit board to the display panel by means of pre-bonding, to lead a crimping impedance by the flexible circuit board;
    detecting the crimping impedance led by the flexible circuit board; and
    screening a detected crimping impedance value to determine whether the one time programmable adjustment is enabled, wherein:
    if the crimping impedance value meets a preset condition, the one time programmable adjustment is enabled, and
    if the crimping impedance value does not meet the preset condition, the one time programmable adjustment is disabled.

2. The auxiliary method of claim 1, wherein the flexible circuit board comprises a crimping terminal area, and the display panel comprises a bonding terminal area corresponding to the crimping terminal area.

3. The auxiliary method of claim 2, wherein a plurality of alignment marks is disposed on both sides of the bonding terminal area and both sides of the crimping terminal area respectively, and the auxiliary method further comprises: crimping the crimping terminal area to the bonding terminal area by aligning the alignment marks.

4. The auxiliary method of claim 1, wherein the crimping terminal area of the flexible circuit board comprises a first crimping impedance test terminal area and the bonding terminal area of the display panel also comprises a second crimping impedance test terminal area, and the first crimping impedance test terminal area is conductive to the second crimping impedance test terminal area.

5. The auxiliary method of claim 1, wherein the auxiliary method further comprises: electrically connecting the flexible circuit board to an impedance test board configured to detect the crimping impedance led by the flexible circuit board.

6. The auxiliary method of claim 5, wherein the auxiliary method further comprises: communicatively connecting the impedance test board to at least one upper computer configured to screen the crimping impedance value detected by the impedance test board to determine whether the one time programmable adjustment is enabled.

7. The auxiliary method of claim 6, further comprising: when receiving a detection command from the upper computer, detecting the crimping impedance led by the flexible circuit board by the impedance test board, and feeding the detected crimping impedance value back to the upper computer after completing detection.

8. The auxiliary method of claim 6, wherein the impedance test board comprises a voltage divider resistor network, an analog-to-digital converter, a microcontroller unit and a serial port, the crimping impedance is introduced as a resistance in the voltage divider resistor network, the analog-to-digital converter is configured to sample a divided voltage value in the voltage divider resistor network, the microcontroller unit is configured to calculate a resistance value of the crimping impedance according to the divided voltage value, and the resistance value is transmitted to the upper computer via the serial port.

9. The auxiliary method of claim 5, wherein the flexible circuit board is electrically connected to an input end of the impedance test board by a zero insertion force method.

10. The auxiliary method of claim 1, wherein the preset condition is that the crimping impedance value is less than or equal to a preset threshold of 0 to 100Ω.

11. The auxiliary method of claim 10, wherein the preset threshold is 10Ω.

12. An auxiliary device for one time programmable adjustment of a display panel, comprising:
    a flexible circuit board crimped and coupled to the display panel by means of pre-bonding; and
    an impedance test board electrically connected to the flexible circuit board;
    wherein the flexible circuit board is configured to lead a crimping impedance, and the impedance test board is configured to detect the crimping impedance led by the flexible circuit board; and
    the impedance test board is communicatively connected to at least one upper computer configured to screen a crimping impedance value detected by the impedance test board to determine whether the one time programmable adjustment is enabled.

13. The auxiliary device of claim 12, wherein the flexible circuit board comprises a crimping terminal area, and the display panel comprises a bonding terminal area corresponding to the crimping terminal area.

14. The auxiliary device of claim 13, wherein a plurality of alignment marks is disposed on both sides of the bonding terminal area and both sides of the crimping terminal area respectively, and the crimping terminal area is crimped to the bonding terminal area by alignment of the alignment marks.

15. The auxiliary device of claim 14, wherein the crimping terminal area of the flexible circuit board comprises a first crimping impedance test terminal area and the bonding terminal area of the display panel also comprises a second crimping impedance test terminal area, and the first crimping impedance test terminal area is conductive to the second crimping impedance test terminal area.

16. The auxiliary device of claim 12, wherein the impedance test board comprises a voltage divider resistor network, an analog-to-digital converter, a microcontroller unit and a serial port; and during operation, the crimping impedance is introduced as a resistance in the voltage divider resistor network, the analog-to-digital converter samples a divided voltage value in the voltage divider resistor network, the microcontroller unit calculates a resistance value of the crimping impedance according to the divided voltage value, and the resistance value is transmitted to the upper computer via the serial port.

\* \* \* \* \*